United States Patent [19]
Tsunoda

[11] Patent Number: 5,698,464
[45] Date of Patent: Dec. 16, 1997

[54] METHOD OF MANUFACTURING A SEMICONDUCTOR DEVICE WITH OXYNITRIDE LAYER

[75] Inventor: Hiroaki Tsunoda, Kawasaki, Japan

[73] Assignee: Kabushiki Kaisha Toshiba, Kawasaki, Japan

[21] Appl. No.: 792,390

[22] Filed: Feb. 3, 1997

Related U.S. Application Data

[63] Continuation of Ser. No. 356,507, Dec. 15, 1994, abandoned.

[30] Foreign Application Priority Data

Dec. 16, 1993 [JP] Japan .................................. 5-316364

[51] Int. Cl.$^6$ .................................................. H01L 21/26
[52] U.S. Cl. .......................... 437/173; 437/239; 437/242
[58] Field of Search .................................. 437/239, 242, 437/173, 235, 238, 174

[56] References Cited

U.S. PATENT DOCUMENTS

| | | | |
|---|---|---|---|
| 5,198,392 | 3/1993 | Fukuda et al. | 437/241 |
| 5,208,189 | 5/1993 | Nguyen et al. | 437/238 |
| 5,254,506 | 10/1993 | Hori | 437/241 |

FOREIGN PATENT DOCUMENTS

| | | | |
|---|---|---|---|
| 0575650A1 | 12/1993 | European Pat. Off. | 437/238 |
| 61-93630A | 5/1986 | Japan | 437/238 |
| 3-79974A | 4/1988 | Japan | 437/238 |
| 4-103125A | 4/1992 | Japan | 437/239 |
| 4-268730A | 9/1992 | Japan | 437/238 |
| 5-259156A | 10/1993 | Japan | 437/238 |
| 07169763A | 7/1995 | Japan . | |

*Primary Examiner*—John Niebling
*Assistant Examiner*—Richard A. Booth
*Attorney, Agent, or Firm*—Finnegan, Henderson, Farabow, Garrett & Dunner, L.L.P.

[57] ABSTRACT

A P-type silicon substrate is heated at about 800° C. in an $O_2$ atmosphere containing HCl, thereby forming a silicon oxide film on the substrate. Then, X rays are applied from an X-ray source to the silicon oxide film, damaging the silicon oxide film and forming many defects therein. Next, the silicon oxide film is heated at about 1000° C. for 60 seconds in an $NH_3$ atmosphere, thereby introducing nitrogen into the silicon oxide film having many defects. As a result, the silicon oxide film changes into an oxynitride film. The oxynitride film is heated to about 1000° C. for 60 seconds in an $O_2$ atmosphere.

4 Claims, 1 Drawing Sheet

METHOD OF MANUFACTURING A SEMICONDUCTOR DEVICE WITH OXYNITRIDE LAYER

This application is a continuation of application Ser. No. 08/356,507 filed Dec. 15, 1994, now abandoned.

BACKGROUND OF THE INVENTION

1. Field of the Invention

The present invention relates to a method of manufacturing a semiconductor device, and more particularly to a method of forming a tunnel oxide film in manufacturing a nonvolatile memory.

2. Description of the Related Art

FIGS. 1 and 2 are sectional views, explaining a conventional method of manufacturing a semiconductor device. In the conventional method, a silicon substrate 1 is exposed at about 800° C. to mixture of oxygen ($O_2$) and HCl. A silicon oxide film 2 about 10 nm thick is thereby formed on the upper surface of the silicon substrate 1 as illustrated in FIG. 1.

Next, as shown in FIG. 2, the film 2 is exposed at about 1000° C. to $NH_3$ in a lamp annealing device (not shown). Nitrogen is thereby introduced into the silicon oxide film 2. As a result, a silicon oxide film 3 containing nitrogen, namely an oxynitride film 3, is formed on the upper surface of the silicon substrate 2. The oxynitride film 3, thus formed, is exposed for given time at about 1000° C. to oxygen ($O_2$).

In the conventional method described above, the silicon oxide film 2 is exposed at about 1000° C. to $NH_3$. Instead, the film 2 may be exposed at about 1000° C. to $N_2O$.

The oxynitride film 3 formed by the conventional method is used as a tunnel oxide in a nonvolatile memory, especially in an $E^2PROM$. The tunnel oxide require high reliability. In particular, it needs not to cause "read disturb".

"Read disturb" occurs when unselected memory cells are programmed by a low voltage (5 V) applied to them during read operation. As known in the art, the read disturbance in a nonvolatile memory is related to the "stress induced leakage" in the MOS capacitor. The larger the "stress induced leakage", the worse the read disturbance. "Stress induced leakage" occurs when an increase in leakage current of tunnel oxide occurs in the low electric-field after a high intense electric field is applied to MOS capacitor with tunnel oxide.

"The stress induced leakage" characteristic of the MOS capacitor depends on the nitrogen concentration of the tunnel oxide. The higher the nitrogen concentration, the less the stress induced leakage. This is why the tunnel oxide film needs to be made of oxynitride which is a material having a sufficiently high nitrogen concentration. The nitrogen concentration of an oxynitride film needs more than 4 atom %.

But, with the above-described conventional method of manufacturing a semiconductor device, it is impossible to introduce a sufficient amount of nitrogen into the oxynitride film 3 which is formed on the upper surface of the silicon substrate 1. Actually, the nitrogen concentration a film formed by the above-described method is less than 1 atom %. Hence, the conventional method cannot provide a tunnel oxide with high reliability.

SUMMARY OF THE INVENTION

The object of the present invention is to provided a method of manufacturing a semiconductor device, in which a silicon oxide film is damaged by irradiation, thereby forming an oxynitride film which has a high nitrogen concentration.

To attain the object, a method of manufacturing a semiconductor device, according to the invention, comprises the steps of:

forming a silicon oxide film on a semiconductor substrate;

irradiating the silicon oxide film with X rays or ultraviolet rays, forming defects in the silicon oxide film; and introducing nitrogen into the silicon oxide film.

When X rays or ultraviolet rays are applied to the silicon oxide film, the silicon oxide film comes to have defects. Nitrogen is introduced into the silicon oxide film, and is eventually retained at the defects. As a result, the film changes into an oxynitride film which has a high nitrogen concentration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be descried, with reference to the accompanying drawings.

Figure 1:
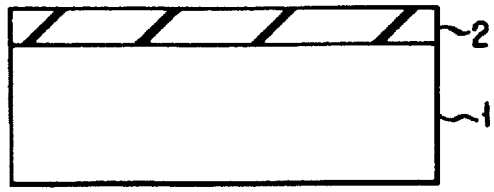
FIG. 1 is a sectional view explaining a conventional method of manufacturing semiconductor device.
Figure 4:
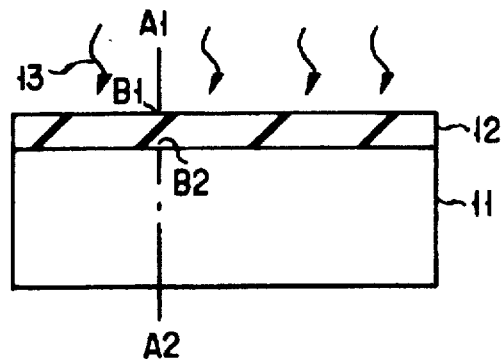
FIG. 4 is a sectional view explaining the step of the method according to the invention, following the step explained by FIG. 3.
Figure 2:
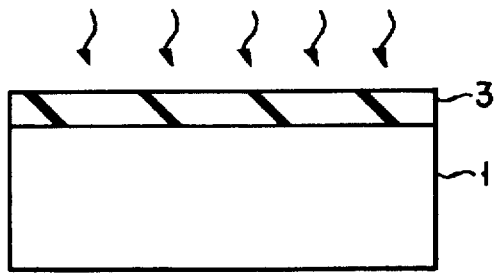
FIG. 2 is a sectional view explaining the step of the conventional method, next to the step explained by FIG. 1.
Figure 5:
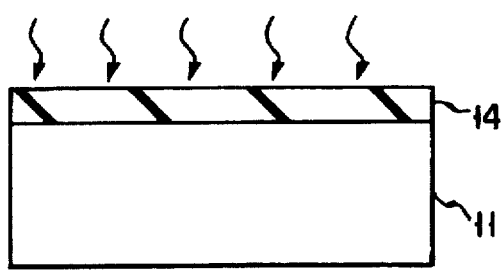
FIG. 5 is a sectional view explaining the step of the method according to the invention, following to the step explained by FIG. 4.
Figure 3:
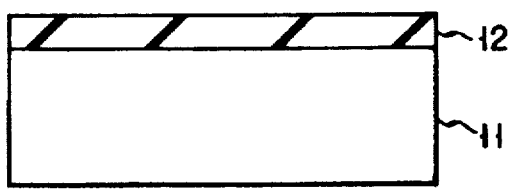
FIG. 3 is a sectional view explaining a method of manufacturing a semiconductor device, according to a first or second embodiment of the invention.

FIGS. 3, 4 and 5 are sectional views, explaining the first embodiment of the invention, i.e., a method of manufacturing a semiconductor device.

First, as shown in FIG. 3, a P-type silicon substrate 11 is exposed at about 800° C. to the mixture of $O_2$ and HCl. A silicon oxide film 12 about 10 nm is thereby formed on the surface of the P-type silicon substrate 11.

Next, as shown in FIG. 4, X rays 13 are irradiated from an X-ray source (not shown) to the silicon oxide film 12. The silicon oxide film 12 is damaged, whereby many defects are formed in the film 12.

Then, as shown in FIG. 5, the film 12 is exposed at about 1000° C. for 60 seconds to $NH_3$ in a lamp annealing device (not shown). Nitrogen is thereby introduced into the silicon oxide film 12 (which has many defects). As a result, the film 12 changes into an oxynitride film 14. The oxynitride film 14, thus formed on the P-type silicon substrate 11, is exposed at 1000° C. for 60 seconds to $O_2$.

Figure 6:
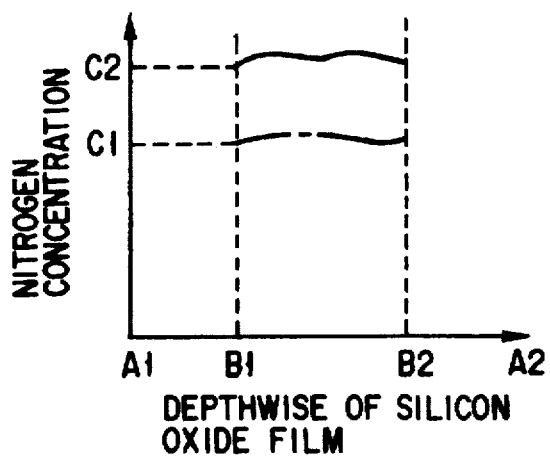
FIG. 6 is a diagram illustrating the nitrogen concentration profile of an oxynitride film formed in the method according to the first or second embodiment of the invention, and also that of an oxynitride film formed in the conventional method.

FIG. 6 is a diagram illustrating the nitrogen concentration profile which an oxynitride film formed in the method according to the first embodiment has depthwise, from point $B_1$ to point $B_2$ on a vertical line $A_1$–$A_2$ shown in FIG. 4. The figure also shows the nitrogen concentration profile of an oxynitride film formed in the conventional method has depthwise. As evident from FIG. 6, the oxynitride film 4 formed in the first embodiment of the invention has a nitrogen concentration $C_2$ of about 4 atom %, whereas the oxynitride film formed in the conventional method has a nitrogen concentration $C_1$ of about 1 atom %.

In the first embodiment, X rays 13 are irradiated to the silicon oxide film 12, thereby damaging the film 12 and forming many defects therein, and then more nitrogen is introduced into the film 12 than can be introduced into a silicon oxide film having no defects. As a result, the silicon oxide film 12 is changed into an oxynitride film 14 which has a nitrogen concentration of about 4 atom %. This is because a nitrogen atom bonds to a Si atom having a unpaired electron and enters a Si—H bond. When the silicon oxide film 12 having many defects made by X-ray irradiation is heated in the $NH_3$ atmosphere, nitrogen is introduced into the silicon oxide film 12. The resultant oxynitride film 14 has a higher nitrogen concentration than a oxynitride film formed in the conventional method. Therefore, the first embodiment of the invention, i.e., the method of manufacturing a semiconductor device, can form a tunnel oxide film of high reliability in manufacturing a nonvolatile memory.

In the first embodiment, X rays 13 are applied from the X-ray source (not shown) to the silicon oxide film 12, damaging the film 12. Instead, ultraviolet rays may be applied from an ultraviolet-ray source to the silicon oxide film 12, to thereby damage the silicon oxide film 12.

Further, instead of nitrogen, halogen atoms may be introduced into the silicon oxide film 12 having many defects. Still further, the oxynitride film 14 may be heated at about 1000° C. for 60 seconds in an $N_2O$ atmosphere, not in an $O_2$ atmosphere as described above. The lamp annealing device may be displaced by a diffusion furnace of ordinary type.

Furthermore, the silicon oxide film 12 may be one formed by CVD (Chemical Vapor Deposition), not a silicon oxide film made by thermal oxidation as in the first embodiment. For example, the film 12 may be one deposited on the silicon substrate 11 by CVD method using $SiH_4$ gas and $N_2O$ gas. Alternatively, it may be one deposited on the silicon substrate 11 by CVD method using TEOS gas and $O_2$ gas.

The temperature and time for heating the silicon oxide film 12, the oxynitride film 14 are not limited to the values specified above, no matter whether a lamp annealing device or an ordinary diffusion furnace is used as a heater.

The second embodiment of the present invention, which is also a method of manufacturing a semiconductor device, will be described with reference to FIGS. 3, 4 and 5, too.

First, as shown in FIG. 3, a silicon oxide film 12 is formed on a P-type silicon substrate 1 in the same way as in the first embodiment. Then, as shown in FIG. 4, X rays are applied to the film 12, forming defects therein, in the same manner as in the first embodiment. Thereafter, as shown in FIG. 5, the film 12 is heated at about 950° C. for 30 minutes in an $N_2O$ atmosphere by means of a diffusion furnace (not shown). Nitrogen is thereby introduced into the silicon oxide film 12 having many defects. As a result, the film 12 is changed into an oxynitride film 14.

The second embodiment achieves the same advantage as the first embodiment.

In the second embodiment, the silicon oxide film 12 having defects is heated at about 950° C. for 30 minutes by means of a diffusion furnace. Instead, the film 12 may be heated at a different temperature for a different period of time by an lamp annealing device, not by a diffusion furnace.

In the first and second embodiments described above, the silicon oxide film 12 having many defects is heated in an $NH_3$ or $N_2O$ atmosphere. Alternatively, the film 12 may be heated in another nitrogen-containing atmosphere such as $NF_3$ atmosphere.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a silicon oxide film on a semiconductor substrate;

irradiating said silicon oxide film with X rays or ultraviolet rays to form defects in said silicon oxide film for retaining nitrogen; and introducing nitrogen into said silicon oxide film at a temperature sufficient to form an oxynitride film on the surface of the silicon oxide film having a nitrogen concentration of at least 4 atom %.

2. A method according to claim 1, wherein said step of introducing nitrogen into said silicon oxide film includes heating said silicon oxide film in an atmosphere containing nitrogen atoms.

3. A method according to claim 1, wherein said step of introducing nitrogen into said silicon oxide film includes heating said silicon oxide film in an atmosphere containing one gas selected from the group consisting of $NH_3$, $N_2O$ and $NF_3$.

4. A method according to claim 1, wherein said silicon oxide film comes to have a nitrogen concentration of about 4 atom % when subjected to said step of introducing nitrogen into said silicon oxide film.

* * * * *